(12) United States Patent
Deng et al.

(10) Patent No.: US 12,476,214 B2
(45) Date of Patent: Nov. 18, 2025

(54) SOLDER INTERCONNECT HIERARCHY FOR HETEROGENEOUS ELECTRONIC DEVICE PACKAGING

(71) Applicant: Intel Corporation, Santa Clara, CA (US)

(72) Inventors: Yue Deng, Chandler, AZ (US); Jung Kyu Han, Chandler, AZ (US); Liang He, Chandler, AZ (US); Gang Duan, Chandler, AZ (US); Rahul N. Manepalli, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 820 days.

(21) Appl. No.: 17/558,297

(22) Filed: Dec. 21, 2021

(65) Prior Publication Data

US 2023/0197660 A1    Jun. 22, 2023

(51) Int. Cl.
*H01L 23/00* (2006.01)
*H01L 23/498* (2006.01)

(52) U.S. Cl.
CPC ........ *H01L 24/16* (2013.01); *H01L 23/49811* (2013.01); *H01L 24/13* (2013.01); *H01L 2224/13109* (2013.01); *H01L 2224/13111* (2013.01); *H01L 2224/16225* (2013.01); *H01L 2924/014* (2013.01)

(58) Field of Classification Search
CPC ... H01L 24/16; H01L 23/49811; H01L 24/13; H01L 2224/13109; H01L 2224/13111; H01L 2224/16225; H01L 2924/014; H01L 23/49816; H01L 23/49827; H01L 23/5385; H01L 24/14; H01L 24/17; H01L 24/81; H01L 23/49838; H01L 23/49866; H01L 2224/161; H01L 2224/16501; H01L 2224/16502

See application file for complete search history.

(56) References Cited

U.S. PATENT DOCUMENTS

| | | | |
|---|---|---|---|
| 6,235,996 B1 * | 5/2001 | Farooq | H01L 23/49811 257/737 |
| 6,335,571 B1 | 1/2002 | Capote et al. | |
| 7,564,139 B2 | 7/2009 | Kuwabara et al. | |
| 8,669,137 B2 | 3/2014 | Nah et al. | |
| 9,426,898 B2 | 8/2016 | Frick et al. | |
| 9,504,168 B2 | 11/2016 | Nagarajan et al. | |
| 2007/0036670 A1 * | 2/2007 | Pereira | C22C 28/00 420/561 |
| 2011/0159228 A1 | 6/2011 | Swaminathan et al. | |
| 2023/0170327 A1 * | 6/2023 | Yang | H01L 25/105 257/737 |

* cited by examiner

*Primary Examiner* — Fernando L Toledo
*Assistant Examiner* — Shawn Shaw Muslim
(74) *Attorney, Agent, or Firm* — Compass IP Law PC

(57) ABSTRACT

A computer apparatus includes a hierarchy of solder joints in a multi-chip package, with solder joints at different levels of the packaging having different melting temperatures. Interconnections, such as pads or pins, on integrated circuit (IC) die can be electrically coupled to ends of contact pillars with solder joints having a higher melting temperature. The other ends of the contact pillars can electrically couple to another substrate or another device with solder joints having a lower melting temperature. The contact pillars can be, for example, a contact array or through-hole via in a substrate.

20 Claims, 5 Drawing Sheets

TABLE 500

| | SOLDER | Tm (°C) | SOLDER JOINT Tm (°C) BASED ON VOLUME RATIO (DIE/SUBSTRATE) | | | |
|---|---|---|---|---|---|---|
| | | | 1 | 2/3 | 1/2 | 1/3 |
| 502 | Sn-15In | 180 | 180 | 200 | 213 | 223 |
| 504 | Sn-20In | 154 | 154 | 183 | 200 | 221 |
| 506 | Sn-25In | 117 | 117 | 172 | 185 | 220 |
| 508 | Sn-30In | 117 | 117 | 154 | 180 | 200 |
| 510 | Sn-0.7Cu | 227 | 227 | 227 | 227 | 227 |

SOLDER INTERCONNECT HIERARCHY FOR HETEROGENEOUS ELECTRONIC DEVICE PACKAGING

FIELD

Descriptions are generally related to semiconductor packages, and more particular descriptions are related to solder interconnects in a semiconductor package.

BACKGROUND

Semiconductor packages continue to increase in complexity, with integration of heterogeneous parts requiring high-bandwidth communication between the parts. Integration of such components in a package increases the demands on thermal compression bonding (TCB) processing to ensure proper electrical connection of the components. Typically, the TCB process window is dependent on bump height variation, where insufficient bump height can result in noncontact open (NCO) failures where the components fail to electrically connect, or solder bridge bump (SBB) failure where the solder melts too soon and does not adhere properly to the components. The process time to form solder joints is short with TCB, making a small window to effectively transfer heat from the bonding head to the substrate for good wetting in the case of a copper (Cu) pad on a substrate, or good melting in the case of a solder bump on a substrate. Such defects go beyond the ability to control based on managing bump height variation.

Increasing complexity in the package architectures has introduced package architectures with multiple levels of interconnect, with the different levels having different ideal solder melting temperatures to ensure interconnection reliability. Mixed pitch and mixed pad size require more careful control of solder bump height and solder volume. One way to address thermal transfer is to increase pedestal temperature, which can improve control over solder height and volume, but which can introduce other negative impacts such as solder corrosion, loss of flux activity, and under-bump-metallization (UBM) dissolutions.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Descriptions of certain details and implementations follow, including non-limiting descriptions of the figures, which may depict some or all examples, and well as other potential implementations.

DETAILED DESCRIPTION

As described herein, a semiconductor package includes a hierarchy of solder joints in a multi-chip package, with solder joints at different levels of the packaging having different melting temperature. Interconnections, such as pads or pins, on integrated circuit (IC) die can be electrically coupled to ends of contact pillars with solder joints having a one melting temperature. The other ends of the contact pillars can electrically couple to another substrate or another device with solder joints having a lower melting temperature. The hierarchy can have the one solder and the second solder at different melting temperatures due to their order in the package processing, with lower temperature solders used for later-bonded solder joints to avoid melting the first solder joints. The contact pillars can be, for example, a contact array or through-hole via in a substrate.

The solder hierarchy can be achieved with the use of lower temperature solder for different levels of the package. In one example, the processing applies a low melting temperature solder alloy hierarchy in the package to enable a larger TCB process window at different interconnects. The solder hierarchy or solder alloy hierarchy can accommodate manufacturability concerns for varying substrates in a heterogeneous package.

Figure 1:
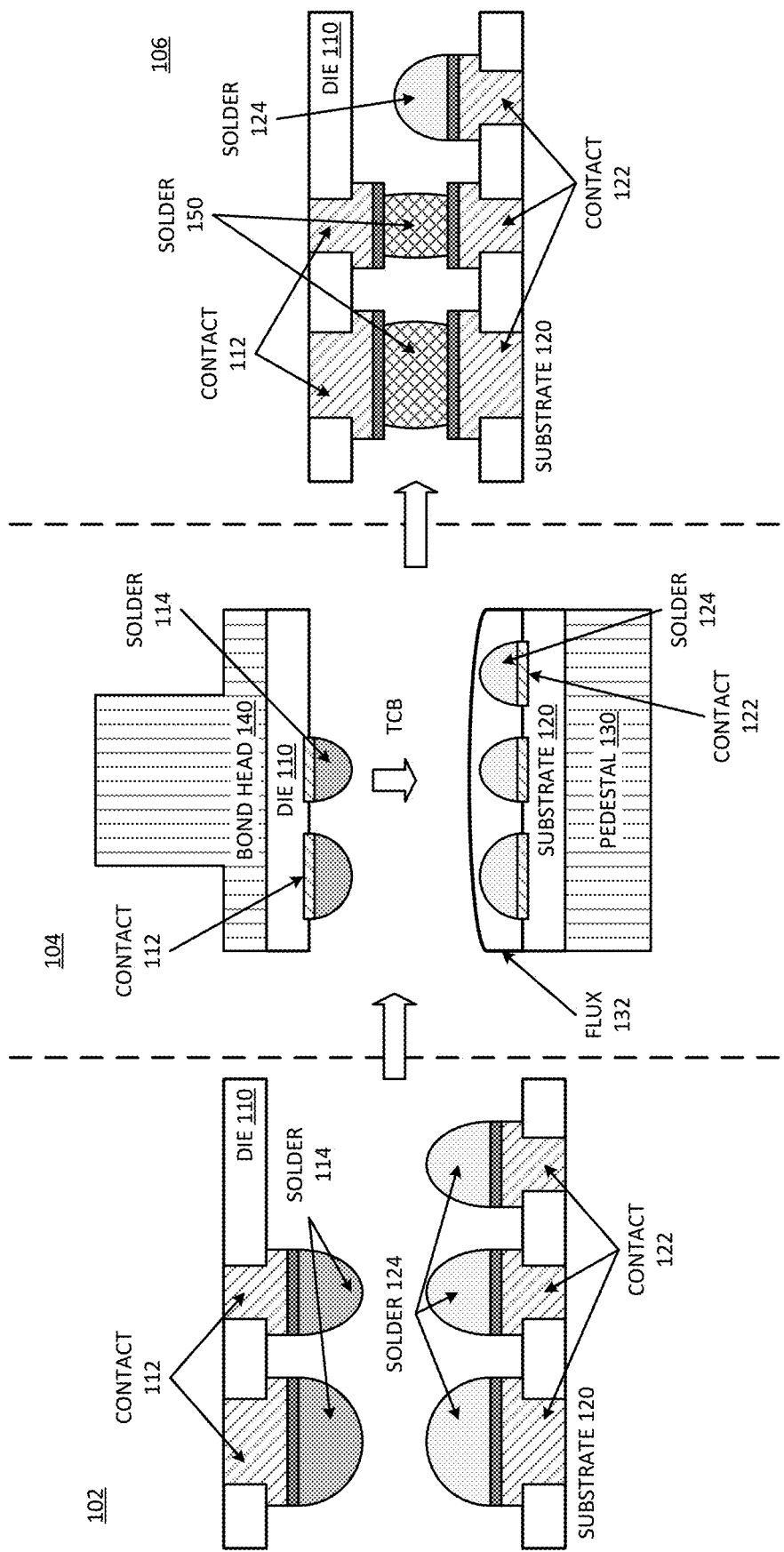
FIG. 1 is a block diagram of an example of creating an electrical interconnection with a low temperature solder alloy.

FIG. 1 is a block diagram of an example of creating an electrical interconnection with a low temperature solder alloy. Circuit 102 illustrates die 110 that will be mounted on substrate 120. Die 110 represents a logic die or electronic device die including circuitry to provide functionality when the die is operational. Die 110 includes contacts 112 that connect to traces or vias in die 110 to make electrical connections to circuitry on die 110.

Substrate 120 represents a substrate to which die 110 will be electrically connected through solder joints. The substrate can be a shared substrate on which multiple logic dies are mounted, an interposer die to connect in a multi-die system, a package substrate, or other die. Substrate 120 includes contacts 122 that connect to traces or vias in substrate 120 to make electrical connections with a package.

Solder 114 represents solder bumps on contacts 112. Circuit 102 illustrates contacts 112 with different sizes, and corresponding solder bumps will also be different sizes. In one example, solder 114 has very high ratio of tin (Sn). In one example, solder 114 is pure tin, or close to pure tin. In one example, solder 124 is low melting temperature solder (LTS), which includes another material that causes melting at a lower temperature than pure tin or a traditional solder that is almost all tin. In one example, solder 124 has a mix of tin and indium (In). The ratio of Sn-to-In can be varied for different system applications.

Circuit 102 is a close view of a portion of a semiconductor assembly. System 104 illustrates a view of circuit 102 in a manufacturing system that will secure die 110 to substrate 120. In one example, system 104 represents a processing system that executes a thermal compression bonding (TCB) process to melt solder 114 and solder 124, to create solder joints that will bond die 110 to substrate 120. In one example, the processing applies LTS for the substrate-side solder, which will allow a lower pedestal temperature, while improving the ability to melt the substrate-side solder when the die-side solder from the hot bonding head contacts the substrate LTS.

Bond head 140 represents processing equipment that secures die 110 for bonding, and heats die 110 to an appropriate temperature to melt solder 114. Bond head 140 can achieve temperatures up to approximately 350° C. In one example, instead of using pure tin, solder 114 on the die side could be an LTS alloy to allow for a lower process temperature. System 104 can have a varied process window based on different solder compositions. Thus, the heat and compression time for the processing can be different based on different solder compositions.

Pedestal 130 represents a platform that holds substrate 120 for processing. With substrate-side solder 124 having a lower melting point than solder 114, and lower than a traditional solder, pedestal 130 can have a lower temperature relative to a traditional TCB process. Pedestal 130 can heat up substrate 120 to melt solder 124 for bonding with solder 114 of die 110, when it is heated by bond head 140.

Flux 132 represents a flux material, which can remove oxidization during the bonding process, resulting in improved adhesion and better alloy mixing. Flux 132 can ensure proper mixing of solder 114 with solder 124, and proper adhesion of the resulting solder joints to contacts 112 and contacts 122.

Circuit 106 represents the final state of the circuit after solder processing. In circuit 106, the die-side solder bumps and the substrate-side solder bumps have combined into solder joints bonding the two components together. Solder 150 represents the solder joints that electrically connect contacts 112 of die 110 to contacts 122 of substrate 120. Solder 150 represents a solder alloy formed by mixing the die-side solder (solder 114) with the substrate-side solder (solder 124).

In one example, circuit 106 is part of a semiconductor device that will subsequently go through a reflow process. A reflow process applies solder to a system board, mounting different parts to the system board. If circuit 106 will be subject to a later reflow process, it is not desirable to have a very low melting temperature for the final solder joint of solder 150. By controlling the composition of solder 124 (the LTS on substrate 120), solder composition of solder 114 (the solder on die 110), and the volumes of the respective solder bumps, the melting temperature of solder 150 can be designed to provide proper package processing, while allowing it to withstand subsequent system processing.

In one example, solder 150 has a solder joint composition with approximately less than 10% In. To achieve a final composition of less than 10% In, solder 114 can be pure Sn, and can have more solder volume than solder 124. Solder 124 can have a solder composition with approximately 10% In, or approximately 15% In, or approximately 20% In, with variations possible based on controller LTS composition and volume. Different ratios and different volumes can be applied to different package levels.

In one example, circuit 106 includes redundant solder bumps, which are not assembled or not bonded with corresponding contacts on the die side. Circuit 106 can include active solder bumps (the bumps that form the solder joints of solder 150) and non-active bumps (represented by the solder bump with solder 124). An elemental analysis for solder 124 will illustrate a different solder composition compared to solder 150.

Contacts 112 can represent contact pillars or interconnections of die 110. Contacts 122 can represent contact pillars or interconnections of substrate 120. Solder 150 represents solder joints that electrically couples contacts 112 to contacts 122. In a stacked architecture (as described below), different ratios of solder can be used within a package, to result in solder joints between different layers of components that have different composition and different melting temperatures. In one example, components to be bonded in later processing sequence will require solder joint having lower melting temperature, while components to be bonded in earliest processes would require solder joint having higher melting temperature. The components that are bonded to each other can be component stacks that were already bonded upstream in the processing, and can then be bonded as a stack directly onto the package substrate.

The processing in system 104 can reduce defects related to thermal transfer, such as a head-and-pillow defects (e.g., NCO defects). Controlling the solder ratios allows for different ratios to be used for different levels of a complex architecture (e.g., EMIB (embedded multi-die interconnect bridge), Co-EMIB (where multiple devices connect to a shared or common embedded interconnect bridge), or ODI (omnidirectional interconnect). The ratio can be changed for different levels of the package.

Figure 2:
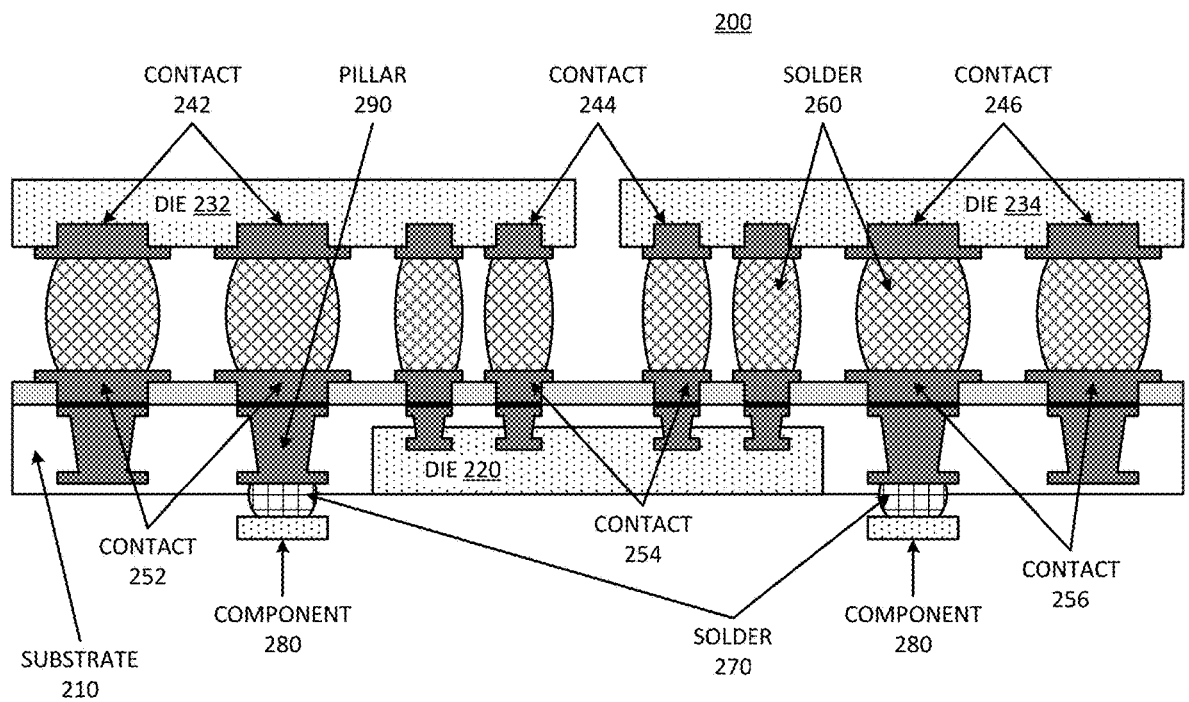
FIG. 2 is a block diagram of an example of a system with an embedded interconnect for individual logic dies, where different layers of a package stack interconnect with solder joints of different melting temperatures.

FIG. 2 is a block diagram of an example of a system with an embedded interconnect for individual logic dies, where different layers of a package stack interconnect with solder joints of different melting temperatures. System 200 represents a multi-component package in accordance with an example of circuit 106.

System 200 provides an example of a system that connects multiple logic dies onto a common package substrate through an embedded interconnect. An example of such a system is EMIB available from INTEL CORPORATION. In system 200, substrate 210 includes embedded die 220, which has connections to die 232 and die 234. Die 220 can be referred to as an embedded bridge die or embedded interconnection bridge. The techniques and technology related to creating die 220 in substrate 210 is not described in detail herein.

Die 232 represents a logic die or a semiconductor component that has integrated circuit (IC) logic created in the die to perform logic operations. Similarly, die 234 represents a logic die or a semiconductor component that has IC logic created in the die to perform logic operations. Both die 232 and die 234 are electrically connected to substrate 210.

In one example, die 232 is connected to substrate 210 with solder joints between contacts 242 and contacts 252. Contacts 242 represent contacts or pads on die 232 to interface with substrate 210. Contacts 252 represent contacts or pads on substrate 210. Die 234 is connected to substrate 210 through solder joints between contacts 246 and contacts 256. Contacts 246 represent contacts or pads on die 234 to interface with substrate 210. Contacts 256 represent contacts or pads on substrate 210.

Die 232 and die 234 include contacts 244 that electrically connect to die 220 of substrate 210. Substrate 210 includes contacts 254 to electrically interface with contacts 244. The processing of system 200 creates solder joints between contacts 244 and contacts 254.

The solder joints between contacts 242 and contacts 252, the solder joints between contacts 244 and contacts 254, and the solder joints between contacts 246 and contacts 256 are represented in system 200 as solder 260. Solder 260 represents solder joints connecting die 232 to substrate 210 and to die 220, as well as solder joints connecting die 234 to substrate 210 and to die 220.

If the side of substrate that connects to die 232 and to die 234 is a first side or top side, the opposite side or bottom side of substrate 210 has solder joints to connect to components 280 on the opposite side. In one example, components 280 represent passive components, such as capacitors (e.g., LSB (land side capacitor)), resistors, or other components. In one example, components 280 represent discrete active components.

While not specifically illustrated, components 280 include pads or pins to interconnect with the interconnections or contacts on substrate 210. Pillar 290 represents a pillar or through-hole via in substrate 210 to interconnect a component or a trace on the top side of substrate 210 to the interconnection on the bottom side that is electrically connected to components 280.

Solder 270 represents solder joints to interconnect pillars 290 to components 280. In one example, the semiconductor processing mounts components 280 after mounting die 232 and die 234 to substrate 210 and die 220. Thus, the solder joints represented by solder 270 are "downstream" in the processing from the solder joints represents by solder 260. In one example, solder 270 has a lower melting temperature than solder 260. In one example, solder 260 is formed in accordance with processing represented in FIG. 1. Solder 270 can be a lower temperature solder applied through a reflow process or other process.

System 200 represents a package with heterogeneous integration. Die 220 can provide high speed or high bandwidth communication between die 232 and die 234. In one example, solder 260 represents a first-level interconnect (FLI) that is applied through TCB, and solder 270 represents a second-level interconnect applied through different processing.

In one example, contacts 252 represent one end of a contact pillar, illustrated as pillar 290, through substrate 210, and the other end of the contact pillar is on the other side of substrate 210. Thus, the one side of the pillar interconnects through solder joints of solder 260 to die 232, and the other side of the pillar interconnects through solder joints of solder 270 to component 280. Solder 270 has a lower melting temperature than solder 260. In one example, substrate 210 represents a package substrate for the multi-die package of system 200. Thus, pillar 290 can represent a via through the package substrate.

Figure 3:
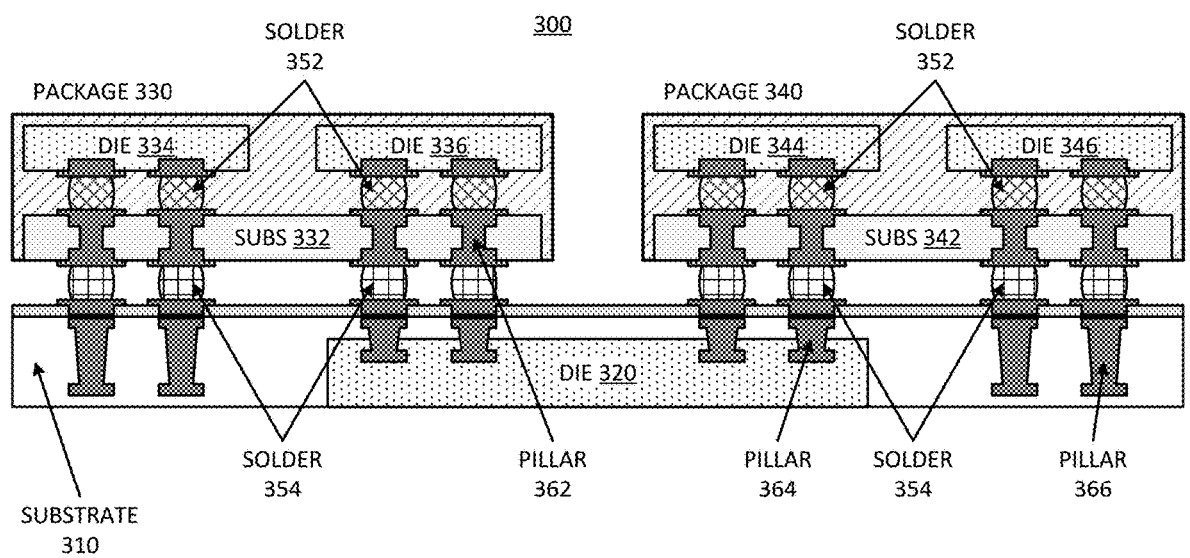
FIG. 3 is a block diagram of an example of a system with an embedded interconnect for multichip devices, where different layers of a package stack interconnect with solder joints of different melting temperatures.

FIG. 3 is a block diagram of an example of a system with an embedded interconnect for multichip devices, where different layers of a package stack interconnect with solder joints of different melting temperatures. System 300 represents a multi-component package in accordance with an example of circuit 106.

System 300 provides an example of a system that connects multi-die packages onto a common package substrate through an embedded interconnect. An example of such a system is Co-EMIB available from INTEL CORPORATION. Co-EMIB allows the interconnection of memory stacks and processor SOC (system on a chip) packages through an embedded interconnect on a common substrate. System 300 can apply to other systems that combine SOC packages on a common die with different levels of processing.

System 300 includes package 330 and package 340 coupled to substrate 310, and coupled to each other through die 320 embedded in substrate 310. Die 320 can be referred to as an embedded bridge die or embedded interconnection bridge. Package 330 includes die 334 and die 336 coupled to substrate (SUBS) 332. Package 340 includes die 344 and die 346 coupled to substrate (SUBS) 342. Die 334, die 336, die 344, and die 346 represent logic dies or semiconductor components with IC logic created in the die to perform logic operations. Package 330 and package 340 represent multi-die packages.

In one example, die 334 and die 336 are connected to substrate 332 with solder joints represented by solder 352. The contacts are not specifically identified. In package 340, die 344 and die 346 are connected to substrate 332 with solder joints represented by solder 352. In one example, the solder composition of the solder joints within package 330 and package 340 are the same or substantially the same, and are thus identified with the same identifier (solder 352).

Package 330 is mounted to substrate 310 with solder joints represented as solder 354. Similarly, package 340 is mounted to substrate 310 with solder joints represented as solder 354. Solder 354 has a different composition than solder 352. In one example, solder 354 has a solder alloy with a lower melting temperature than the solder alloy of solder 352. While there are many types of solder alloys, one alloy is formed of tin (Sn) and indium (In). Consider an example where solder 354 has a lower ratio of Sn-to-In than solder 352; thus, there would more indium in solder 354 than solder 352, resulting in an alloy with lower melting temperature. Other alloys and ratios of elements can produce similar differences in solder melting temperature.

Substrate 310 can include contact or interconnects with pillars to connect through the package substrate to package pads. Die 320 also includes contacts or interconnects to connect with contacts of package 330 and package 340, or with their respective interposer substrates, substrate 332 and substrate 342. System 300 identifies three pillars or interconnections, which can be considered representative of the pillars or posts for electrical connection in system 300. Pillar 362 represents an interconnection through substrate 332 in the multi-die packages (package 330 and package 340). Pillar 362 has one end connected to a solder joint having one composition (solder 352) and the other end connected to a solder joint having a different composition (solder 354).

Pillar 364 represents an interconnection with one end connected to a solder joint and the other end connected within a bridge die. Pillar 366 represents an interconnection with one end connected to a solder joint and the other end connected within the package substrate, substrate 310.

System 300 can have different solder alloys to control for different layers of interconnection. For example, a solder with a higher temperature alloy can be formed on components that will be assembled first. Thus, solder 352 can have a higher temperature alloy, as package 330 and package 340 will be assembled before being mounted onto substrate 310. The solder layer represented by solder 354 can have an alloy with a lower melting temperature, to allow for good control over the assembling of system 300, making good solder connection the package while being a low enough temperature to not melt solder 352 within package 330 and package 340.

As illustrated in system 300, the package substrate of package 330 and package 340 can have one type of solder joint for processing the component packages. Substrate 310 can be a second package substrate to electrically connect to the component packages, with a hierarchy of solder joints for the multi-die packaging.

Figures 4, 5:
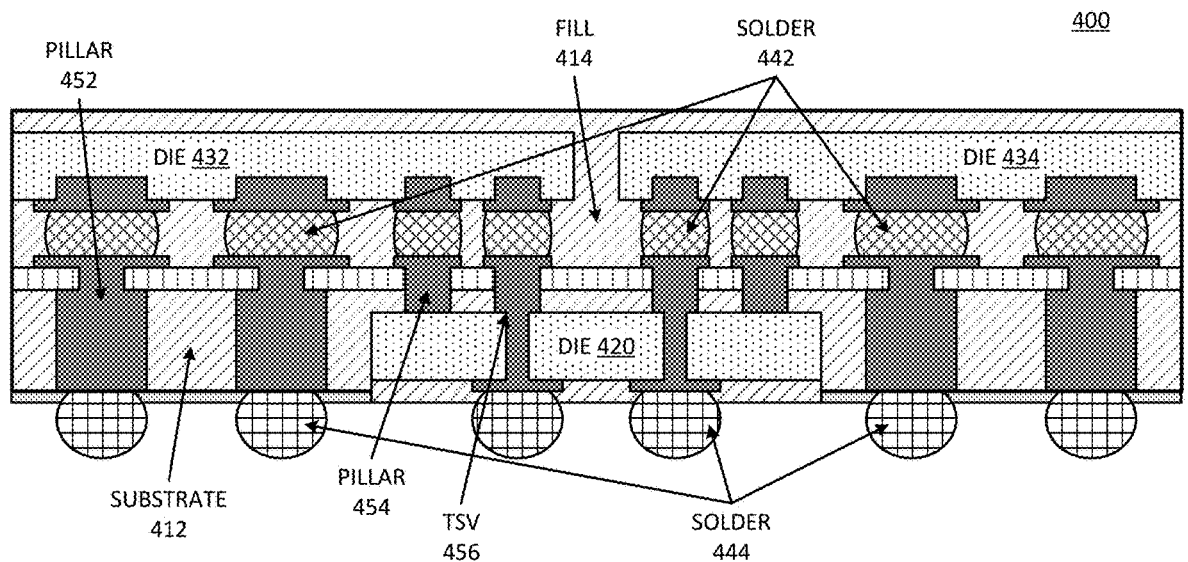
FIG. 4 is a block diagram of an example of a system with an omnidirectional interconnect, where different layers of a package stack interconnect with solder joints of different melting temperatures.
FIG. 5 is a table illustrating an example of different solder joint melting temperatures.

FIG. 4 is a block diagram of an example of a system with an omnidirectional interconnect, where different layers of a package stack interconnect with solder joints of different melting temperatures. System 400 represents a multi-component package in accordance with an example of circuit 106.

System 400 provides an example of a system that connects multi-die packages onto a common package substrate with an embedded bridge for horizontal communication or for vertical communication through packages. An example of such a system is ODI (OmniDirectional Interconnect) available from INTEL CORPORATION. ODI allows the interconnection of memory stacks and processor SOC (system on a chip) packages through an embedded interconnect on a common substrate for horizontal communication between dies or chiplets, as well as vertical communication through vias through the substrate or interposer to another level of interconnection. System 400 can apply to other systems that combine SOC packages on a common die with different levels of processing.

System 400 includes die 432 and die 434 coupled to pillars and TSVs (through-silicon vias). The pillars and TSVs can be bound together with a housing or a fill that creates a layer represented by substrate 412. In one example, die 432 and die 434 are coupled to each other through die 420 embedded in substrate 412 or to other layers through substrate 412 or through die 420. Die 432 and die 434 could also be coupled to each other as a package, represented by fill 414. Fill 414 represents a material that combines die 432 and die 434 in an encapsulated package. In one example, fill 414 and substrate 412 are the same material to encapsulate die 432, die 434, and the pillars and vias for interconnection. Die 420 can be embedded within the encapsulated package.

Die 420 can be referred to as an embedded bridge die or embedded interconnection bridge. Die 420 allows horizontal communication between die 432 and die 434, as well as vertical communication to additional layers below (not specifically illustrated). System 400 can be part of a larger multi-die system having multiple packages and interconnects. In one example, die 432 can be replaced with a package including multiple dies. Similarly, die 434 could be replaced with a package having multiple dies.

The interconnections in system 400 includes pillars and TSVs. Pillar 452 represents a vertical connection between die 432 and another substrate or component on the other side of substrate 412. Pillar 454 represents a vertical interconnection from die 432 to die 420 and from die 434 to die 420. TSV 456 represents a vertical interconnection from die 432 (or die 434) through die 420 to another substrate or component on the other side of substrate 412.

Solder 442 represents a first level of solder joint between die 432 and substrate 412 and between die 434 and substrate 412. Solder 444 represents a second level of solder joint between substrate 412 and another substrate or device packaging.

System 400 can have different solder alloys to control for different layers of interconnection. For example, solder 442 can represent a solder with a higher temperature alloy. The solder layer represented by solder 444 can have an alloy with a lower melting temperature. It will be understood that system 400 can include additional layers of solder beyond what is illustrated, and the solder hierarchy can be continued to the additional layers of solder.

FIG. 5 is a table illustrating an example of different solder joint melting temperatures. Table 500 identifies different melting temperatures (Tm) for solder joints of different composition. The different compositions of solder can be applied as solder bumps to different substrates or surfaces to achieve different melting temperatures and then create solder joints between components or between layers by combination of the solder bumps in processing.

Table 500 includes a solder column indicating a percentage of indium in a low temperature solder alloy, where the reference has a format Sn-% In, with the number indicating the percentage of the solder alloy that is indium. The melting temperature column indicates the melting temperature in degrees Celsius for the solder alloy alone. The remaining columns indicate the melting temperature of a solder joint formed with the solder alloy on a substrate and another alloy or pure tin on a die. Thus, the '1' column represents the same alloy on the die and substrate. The '2/3' column indicates 2/3 of the solder joint volume is the alloy, with the other third being pure tin. The '1/2' column indicates 1/2 of the solder joint volume is the alloy, with the other half being pure tin. The '1/3' column indicates 1/3 of the solder joint volume is the alloy, with the other two-thirds being pure tin.

Row 502 represents a solder having 15 percent indium (Sn-15In), with a melting temperature of 180 C. Row 504 represents a solder having 20 percent indium (Sn-20In), with a melting temperature of 154 C. Row 506 represents a solder having 20 percent indium (Sn-20In), with a melting temperature of 117 C. Row 508 represents a solder having 20 percent indium (Sn-20In), with a melting temperature of 117 C. Row 510 represents a solder having 0.7 percent copper (Sn-0.7Cu), with a melting temperature of 227 C.

The various rows have solder joint melting temperatures as follows. Row 502 has temperatures of 180, 200, 213, and 223 for columns 1, 2/3, 1/2, and 1/3, respectively. Row 504 has temperatures of 154, 183, 200, and 221 for columns 1, 2/3, 1/2, and 1/3, respectively. Row 506 has temperatures of 117, 172, 185, and 220 for columns 1, 2/3, 1/2, and 1/3, respectively. Row 508 has temperatures of 117, 154, 180, and 200 for columns 1, 2/3, 1/2, and 1/3, respectively. Row 510 has temperatures of 227 for all columns.

Table 500 represents one example of values for selected solder composition ratios and selected solder joint volume ratios. It will be understood that different compositions and different volume ratios will have different values. Whatever the specific values for the specific ratios selected, table 500 illustrates that the processing can tune the plating process to control solder volume and solder composition mixes to control the solder temperature for different processing layers in the package processing.

Figure 6:
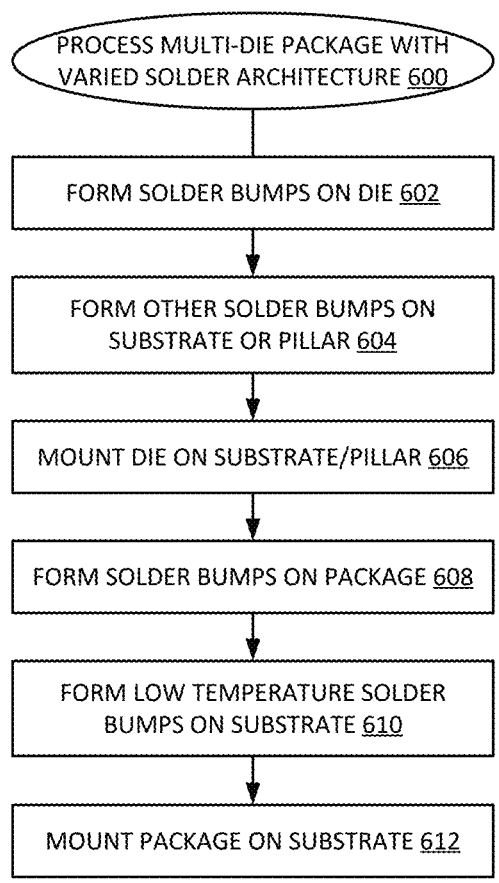
FIG. 6 is a flow diagram of an example of a process for processing a multi-die package with a varied solder architecture.

FIG. 6 is a flow diagram of an example of a process for processing a multi-die package with a varied solder architecture. Process 600 represents a process for multi-die package processing with a solder hierarchy that can be applied to any system described herein.

In one example, the processing forms solder bumps on the die or package to be mounted to a substrate, at 602. The composition and volume ratio can be selected to result in a specific temperature alloy depending on the solder level in the system processing. In one example, the processing forms solder bumps on a substrate or pillar or interconnection to which the die or package will be connected, at 604. As with the die-side solder bumps, the substrate-side solder bumps can be selected for composition and volume ratio to result in a specific temperature alloy depending on the solder level in the system processing.

The processing can mount the die on the substrate or pillar, at 606. The mounting can include heating of the components to be mounted based on the solder composition of the bumps. The processing applies heat to melt the solder and cause an electrical interconnection. Such mounting processing can form first solder joints in a package.

In one example, the processing forms solder bumps on a package created with the die and substrate/pillar previously created, at 608. In one example, the processing forms low temperature solder bumps on a package substrate to which the package will be mounted, at 610. The processing can then mount the package on the substrate, at 612. The mounting of the package on the substrate can result in solder joints between the package and package substrate that are different in composition and melting temperature relative to the solder joints between the die and the component to which the die is mounted. Thus, the final package will have a hierarchy of solder temperatures based on where the solder joints are formed in the processing.

Figure 7:
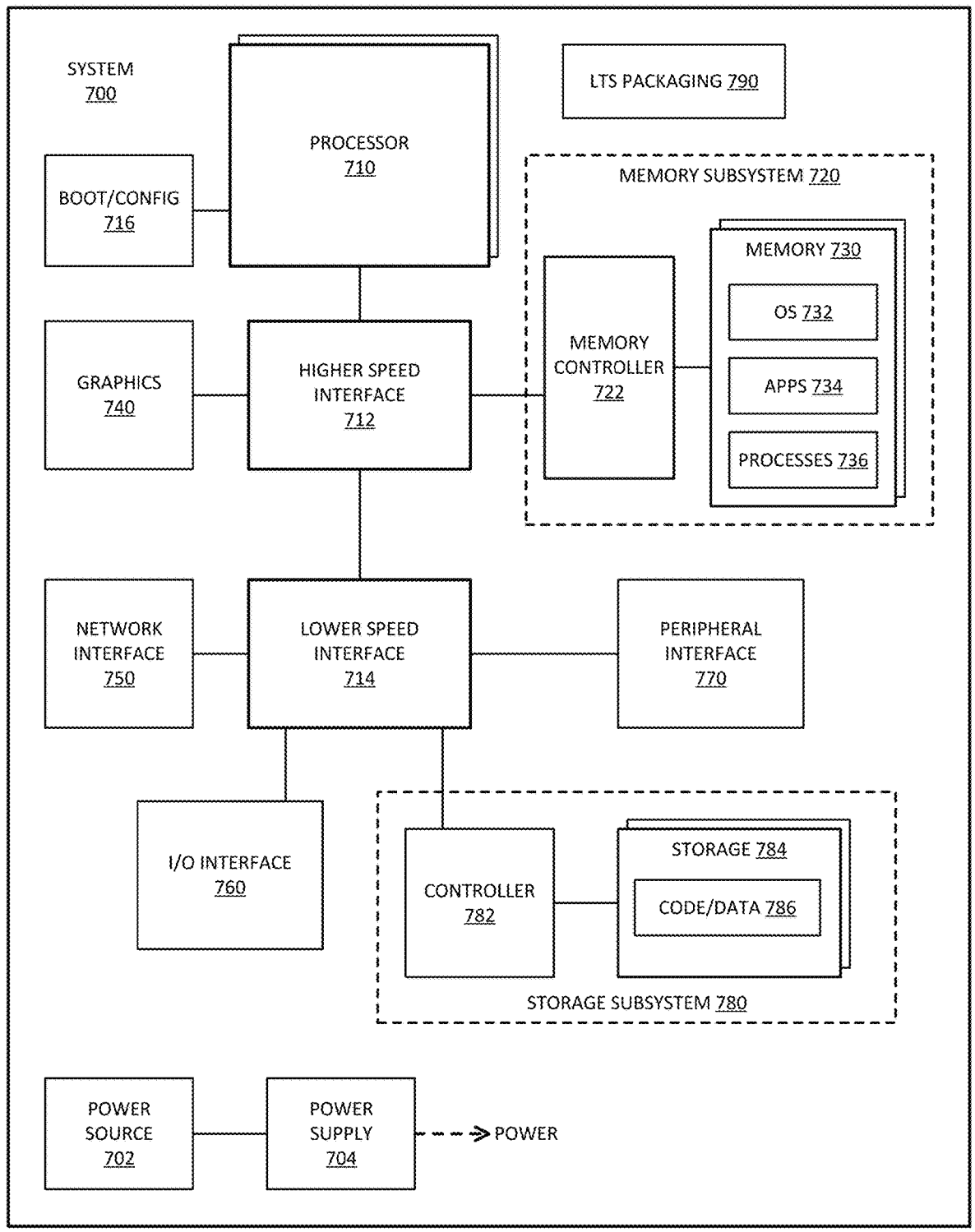
FIG. 7 is a block diagram of an example of a computing system in which a semiconductor package with a hierarchical solder architecture can be implemented.

FIG. 7 is a block diagram of an example of a computing system in which a semiconductor package with a hierarchical solder architecture can be implemented. System 700 represents a computing device in accordance with any example herein, and can be a laptop computer, a desktop computer, a tablet computer, a server, a gaming or entertainment control system, embedded computing device, or other electronic device.

In one example, system 700 includes LTS (low temperature solder) packaging 790. LTS packaging 790 represents packaging for multiple components of system 700. For example, LTS packaging 790 can provide packaging with a solder hierarchy for processing of processor 710, interconnection components such as interface 712 and interface 714, graphics 740, memory subsystem 720, or other components of system 700. Typically, LTS packaging 790 would combine more than one component in multi-die packaging.

System 700 includes processor 710 can include any type of microprocessor, central processing unit (CPU), graphics processing unit (GPU), processing core, or other processing hardware, or a combination, to provide processing or execution of instructions for system 700. Processor 710 can be a host processor device. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or a combination of such devices.

System 700 includes boot/config 716, which represents storage to store boot code (e.g., basic input/output system (BIOS)), configuration settings, security hardware (e.g., trusted platform module (TPM)), or other system level hardware that operates outside of a host OS. Boot/config 716 can include a nonvolatile storage device, such as read-only memory (ROM), flash memory, or other memory devices.

In one example, system 700 includes interface 712 coupled to processor 710, which can represent a higher speed interface or a high throughput interface for system components that need higher bandwidth connections, such as memory subsystem 720 or graphics interface components 740. Interface 712 represents an interface circuit, which can be a standalone component or integrated onto a processor die. Interface 712 can be integrated as a circuit onto the processor die or integrated as a component on a system on a chip. Where present, graphics interface 740 interfaces to graphics components for providing a visual display to a user of system 700. Graphics interface 740 can be a standalone component or integrated onto the processor die or system on a chip. In one example, graphics interface 740 can drive a high definition (HD) display or ultra high definition (UHD) display that provides an output to a user. In one example, the display can include a touchscreen display. In one example, graphics interface 740 generates a display based on data stored in memory 730 or based on operations executed by processor 710 or both.

Memory subsystem 720 represents the main memory of system 700, and provides storage for code to be executed by processor 710, or data values to be used in executing a routine. Memory subsystem 720 can include one or more varieties of random-access memory (RAM) such as DRAM, 3DXP (three-dimensional crosspoint), or other memory devices, or a combination of such devices. Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software logic to provide functions for system 700. In one example, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710, such as integrated onto the processor die or a system on a chip.

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 700 includes interface 714, which can be coupled to interface 712. Interface 714 can be a lower speed interface than interface 712. In one example, interface 714 represents an interface circuit, which can include standalone components and integrated circuitry. In one example, multiple user interface components or peripheral components, or both, couple to interface 714. Network interface 750 provides system 700 the ability to communicate with remote devices (e.g., servers or other computing devices) over one or more networks. Network interface 750 can include an Ethernet adapter, wireless interconnection components, cellular network interconnection components, USB (universal serial bus), or other wired or wireless standards-based or proprietary interfaces. Network interface 750 can exchange data with a remote device, which can include sending data stored in memory or receiving data to be stored in memory.

In one example, system 700 includes one or more input/output (I/O) interface(s) 760. I/O interface 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one example, system 700 includes storage subsystem 780 to store data in a nonvolatile manner. In one example, in certain system implementations, at least certain components of storage 780 can overlap with components of memory subsystem 720. Storage subsystem 780 includes storage device(s) 784, which can be or include any conventional medium for storing large amounts of data in a nonvolatile manner, such as one or more magnetic, solid state, NAND, 3DXP, or optical based disks, or a combination. Storage 784 holds code or instructions and data 786 in a persistent state (i.e., the value is retained despite interruption of power to system 700). Storage 784 can be generically considered to be a "memory," although memory 730 is typically the executing or operating memory to provide instructions to processor 710. Whereas storage 784 is nonvolatile, memory 730 can include volatile memory (i.e., the value or state of the data is indeterminate if power is interrupted to system 700). In one example, storage subsystem 780 includes controller 782 to interface with storage 784. In one example controller 782 is a physical part of interface 714 or processor 710, or can include circuits or logic in both processor 710 and interface 714.

Power source 702 provides power to the components of system 700. More specifically, power source 702 typically interfaces to one or multiple power supplies 704 in system 700 to provide power to the components of system 700. In one example, power supply 704 includes an AC to DC (alternating current to direct current) adapter to plug into a wall outlet. Such AC power can be renewable energy (e.g., solar power) power source 702. In one example, power source 702 includes a DC power source, such as an external AC to DC converter. In one example, power source 702 or power supply 704 includes wireless charging hardware to charge via proximity to a charging field. In one example, power source 702 can include an internal battery or fuel cell source.

In general with respect to the descriptions herein, in one example an apparatus includes: an integrated circuit (IC) die having first interconnections electrically coupled to a first end of contact pillars with first solder joints; and second interconnections electrically coupled to a second end of the contact pillars with second solder joints; wherein the second solder joints have a lower melting temperature than the first solder joints.

In one example of the apparatus, the first solder joints and the second solder joints include tin (Sn) and indium (In). In accordance with any preceding example of the apparatus, in one example, the first solder joints have a higher ratio of Sn-to-In than the second solder joints. In accordance with any preceding example of the apparatus, in one example, the first solder joints have approximately less than 10% In. In accordance with any preceding example of the apparatus, in one example, the contact pillars comprise through-hole pillars of a package substrate. In accordance with any preceding example of the apparatus, in one example, the package substrate comprises an interposer substrate. In accordance with any preceding example of the apparatus, in one example, the package substrate comprises a first package substrate, and wherein the second interconnections comprise interconnections of second package substrate electrically coupled to the first package substrate. In accordance with any preceding example of the apparatus, in one example, the contact pillars comprise contact pillars of an embedded multi-die interconnect bridge (EMIB) package. In accordance with any preceding example of the apparatus, in one example, the contact pillars comprise contact pillars of an omnidirectional interconnect (ODI) package. In accordance with any preceding example of the apparatus, in one example, the IC die is mounted to a first side of the package substrate, and wherein the second interconnections comprise interconnections of a component mounted on a second side of the package substrate.

In general with respect to the descriptions herein, in one example a computer system includes: a system board; and a system on a chip (SOC) package mounted on the system board, the SOC package including an integrated circuit (IC) die having first interconnections electrically coupled to a first end of contact pillars with first solder joints; and second interconnections electrically coupled to a second end of the contact pillars with second solder joints; wherein the second solder joints have a lower melting temperature than the first solder joints.

In one example of the computer system, the first solder joints and the second solder joints include tin (Sn) and indium (In), wherein the first solder joints have a higher ratio of Sn-to-In than the second solder joints. In accordance with any preceding example of the computer system, in one example, the first solder joints have approximately less than 10% In. In accordance with any preceding example of the computer system, in one example, the contact pillars comprise through-hole pillars of a package substrate. In accordance with any preceding example of the computer system, in one example, the package substrate comprises an interposer substrate. In accordance with any preceding example of the computer system, in one example, the package substrate comprises a first package substrate, and wherein the second interconnections comprise interconnections of second package substrate electrically coupled to the first package substrate. In accordance with any preceding example of the computer system, in one example, the contact pillars comprise contact pillars of an embedded multi-die interconnect bridge (EMIB) package. In accordance with any preceding example of the computer system, in one example, the contact pillars comprise contact pillars of an omnidirectional interconnect (ODI) package. In accordance with any preceding example of the computer system, in one example, the IC die is mounted to a first side of the package substrate, and wherein the second interconnections comprise interconnections of a component mounted on a second side of the package substrate. In accordance with any preceding example of the computer system, in one example, the computer system includes: a multicore host processor mounted on the system board; a display communicatively coupled to a host processor; a network interface communicatively coupled to a host processor; or a battery to power the computer system.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus, comprising:
   an integrated circuit (IC) die having first interconnections electrically coupled to a first end of contact pillars with first solder bumps; and
   second interconnections electrically coupled to a second end of the contact pillars with second solder bumps;
   wherein the first solder bumps are to be combined with third solder bumps with a first soldering technique to form first solder joints and the second solder bumps are to be combined with fourth solder bumps with a second soldering technique to form second solder joints having a lower melting temperature than the first solder joints.

2. The apparatus of claim 1, wherein the first solder joints and the second solder joints include tin (Sn) and indium (In).

3. The apparatus of claim 2, wherein the first solder joints have a higher ratio of Sn-to-In than the second solder joints.

4. The apparatus of claim 2, wherein the first solder joints have approximately less than 10% In.

5. The apparatus of claim 1, wherein the contact pillars comprise through-hole vias of a package substrate.

6. The apparatus of claim 5, wherein the package substrate comprises an interposer substrate.

7. The apparatus of claim 5, wherein the package substrate comprises a first package substrate, and wherein the second interconnections comprise interconnections of second package substrate electrically coupled to the first package substrate.

8. The apparatus of claim 7, wherein the contact pillars comprise contact pillars of an embedded multi-die interconnect bridge (EMIB) package.

9. The apparatus of claim 7, wherein the contact pillars comprise contact pillars of an omnidirectional interconnect (ODI) package.

10. The apparatus of claim 5, wherein the IC die is mounted to a first side of the package substrate, and wherein the second interconnections comprise interconnections of a component mounted on a second side of the package substrate.

11. A computer system, comprising:
    a system board; and
    a system on a chip (SOC) package mounted on the system board, the SOC package including
      an integrated circuit (IC) die having first interconnections electrically coupled to a first end of contact pillars with first solder bumps; and
      second interconnections electrically coupled to a second end of the contact pillars with second solder bumps;
      wherein the first solder bumps are to be combined with third solder bumps with a first soldering technique to form first solder joints and the second solder bumps are to be combined with fourth solder bumps with a second soldering technique to form second solder joints having a lower melting temperature than the first solder joints.

12. The computer system of claim 11, wherein the first solder joints and the second solder joints include tin (Sn) and indium (In), wherein the first solder joints have a higher ratio of Sn-to-In than the second solder joints.

13. The computer system of claim 12, wherein the first solder joints have approximately less than 10% In.

14. The computer system of claim 11, wherein the contact pillars comprise through-hole pillars of a package substrate.

15. The computer system of claim 14, wherein the package substrate comprises an interposer substrate.

16. The computer system of claim 14, wherein the package substrate comprises a first package substrate, and wherein the second interconnections comprise interconnections of second package substrate electrically coupled to the first package substrate.

17. The computer system of claim 16, wherein the contact pillars comprise contact pillars of an embedded multi-die interconnect bridge (EMIB) package.

18. The computer system of claim 16, wherein the contact pillars comprise contact pillars of an omnidirectional interconnect (ODI) package.

19. The computer system of claim 14, wherein the IC die is mounted to a first side of the package substrate, and wherein the second interconnections comprise interconnections of a component mounted on a second side of the package substrate.

20. The computer system of claim 11, further comprising one or more of:
- a multicore host processor mounted on the system board;
- a display communicatively coupled to a host processor;
- a network interface communicatively coupled to a host processor; or
- a battery to power the computer system.

* * * * *